(12) United States Patent
Hsu et al.

(10) Patent No.: US 7,985,090 B2
(45) Date of Patent: Jul. 26, 2011

(54) SOCKET WITH AN IMPROVED COVER LID

(75) Inventors: Hsiu-Yuan Hsu, Tu-Cheng (TW); Wei-Chih Lin, Tu-Cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 58 days.

(21) Appl. No.: 12/506,434

(22) Filed: Jul. 21, 2009

(65) Prior Publication Data
US 2010/0015821 A1    Jan. 21, 2010

(30) Foreign Application Priority Data

Jul. 21, 2008  (TW) ................................ 97212994 U

(51) Int. Cl.
*H01R 13/62* (2006.01)
(52) U.S. Cl. ........................................ 439/331; 220/326
(58) Field of Classification Search .................. 439/330, 439/331; 220/326
See application file for complete search history.

(56) References Cited

U.S. PATENT DOCUMENTS

| | | | |
|---|---|---|---|
| 3,771,109 A * | 11/1973 | Bruckner et al. | 439/331 |
| 3,846,737 A * | 11/1974 | Spaulding | 439/331 |
| 3,953,101 A * | 4/1976 | Palecek | 439/331 |
| 4,212,415 A * | 7/1980 | Neely | 222/231 |
| 4,952,160 A * | 8/1990 | Olsen | 439/142 |
| 5,247,250 A * | 9/1993 | Rios | 324/754 |
| 5,577,779 A * | 11/1996 | Dangel | 292/80 |
| 5,609,497 A | 3/1997 | Kawabe | |
| 6,398,594 B1 * | 6/2002 | Bonilla et al. | 439/731 |
| 6,786,332 B1 * | 9/2004 | Patrick et al. | 206/305 |
| 7,210,953 B2 * | 5/2007 | Hayakawa | 439/331 |
| 7,413,479 B1 * | 8/2008 | Volpone | 439/692 |
| 7,553,180 B2 * | 6/2009 | Hu et al. | 439/352 |
| 7,878,822 B2 * | 2/2011 | Korczynski et al. | 439/76.2 |

* cited by examiner

*Primary Examiner* — Neil Abrams
(74) *Attorney, Agent, or Firm* — Wei Te Chung; Andrew C. Cheng; Ming Chieh Chang

(57) ABSTRACT

A socket (100) comprises an insulative housing (1) with a number of passageways (13) thereon. A number of contacts are received in the passageways. A cover lid (3) rotationally is assembled to the housing to be in an open position or a closed position. The cover lid comprises a latch member (31) integrally molded thereon to reduce the component of the socket, and the insulative housing forms a step portion (15) for mating with the latch member to keep the cover lid in the closed position.

6 Claims, 4 Drawing Sheets

SOCKET WITH AN IMPROVED COVER LID

BACKGROUND OF THE INVENTION

1. Field of the Invention

The present invention relates to a socket, especially to a socket for electrically connecting an Integrated Circuit (IC) package to a printed circuit board.

2. Description of Prior Art

A typical socket, used for electrically connecting an Integrated Circuit and a printed circuit board, comprises a base and a cover lid. The cover lid is attached to the base rotationally pivoted between a closed and a opened position. And the socket further has a holding means for holding the cover lid on the base. The holding means is located at the free end of the cover lid, and comprises an axle and a latch member rotating around the axle. The base forms a step portion for engaging with the latch member for keeping the cover lid in a closed position firmly. When the holding means is assembled to the cover lid, the axle penetrates through the latch member, and then is attached on the cover lid. In this state, there are too many components to be assembled, and the cost of the socket will be high.

Hence, it is desirable to have an improved socket to overcome the above-mentioned disadvantages of the prior art.

BRIEF SUMMARY OF THE INVENTION

Accordingly, the object of the present invention is to provide a socket with an improved cover lid integrally molded a latch member.

In order to achieve the above-mentioned object, a socket, for electrically connecting an IC package and a printed circuit board, comprises an insulative housing with a plurality of passageways thereon, and defining a receiving room for receiving the IC package to be tested therein. A plurality of contacts are received in the passageways and extending into the receiving room. A floatable board is received in the receiving room for abutting the IC package. A cover lid is rotationally assembled to the housing from an opened to a closed position. The cover lid comprises a latch member integrally molded thereon, and the insulative housing forms a step portion for mating with the latch member to keep the cover lid in the closed position.

Other objects, advantages and novel features of the invention will become more apparent from the following detailed description of the present embodiment when taken in conjunction with the accompanying drawings.

DETAILED DESCRIPTION OF THE INVENTION

Figure 1:
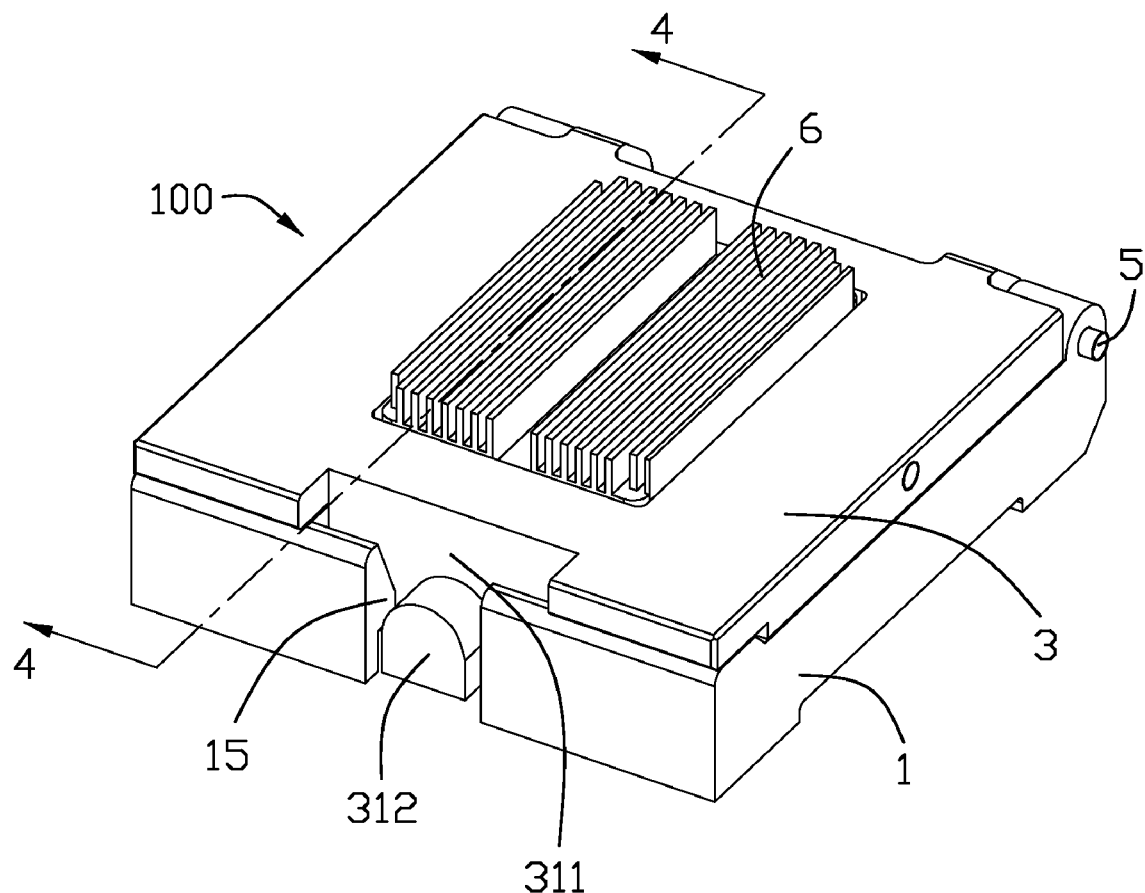
FIG. 1 is a perspective view of a socket in accordance with the present invention.

Reference will now be made to the drawing figures to describe the present invention in detail.

Figure 2:
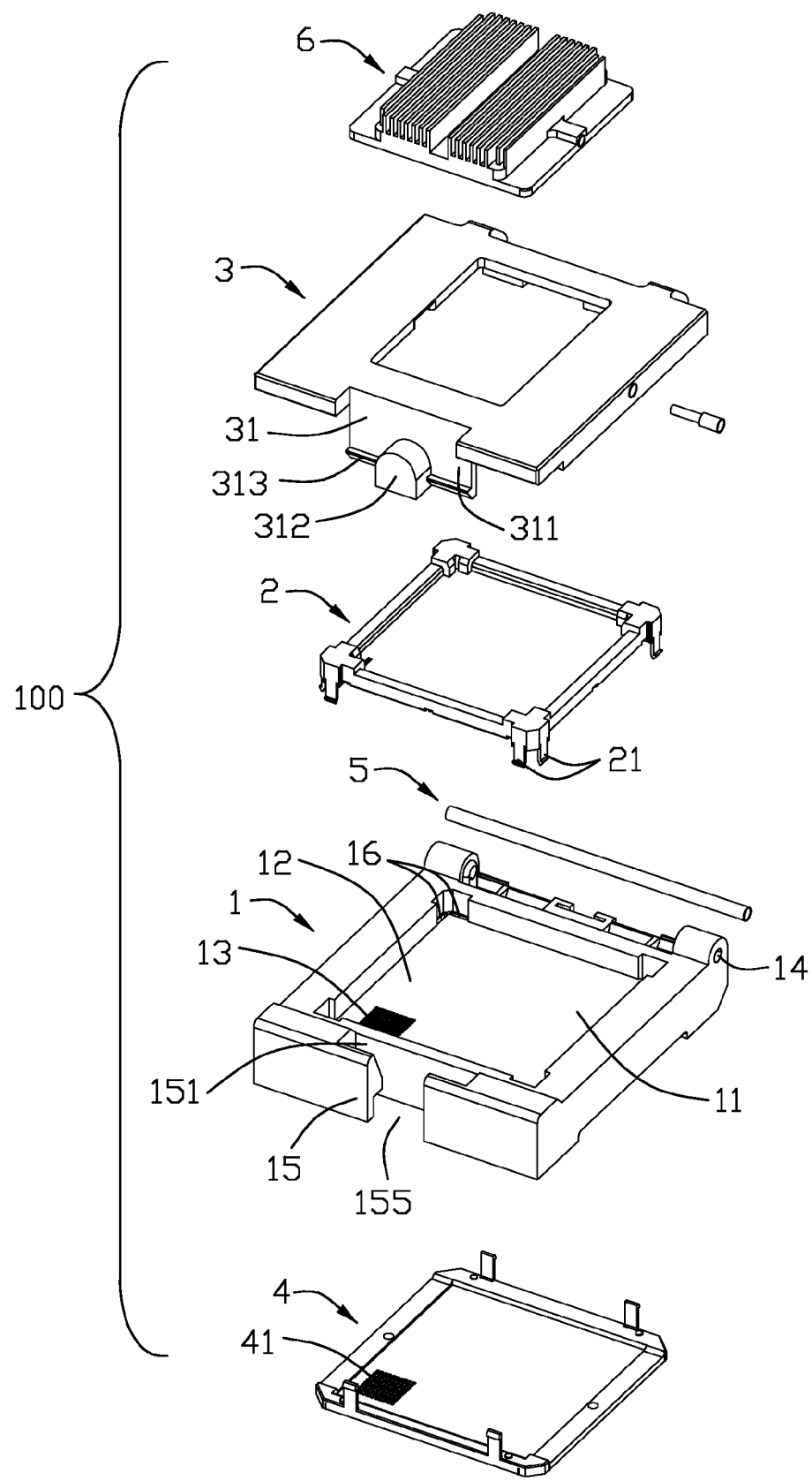
FIG. 2 is an exploded, perspective view of the socket shown in FIG. 1.
Figure 3:
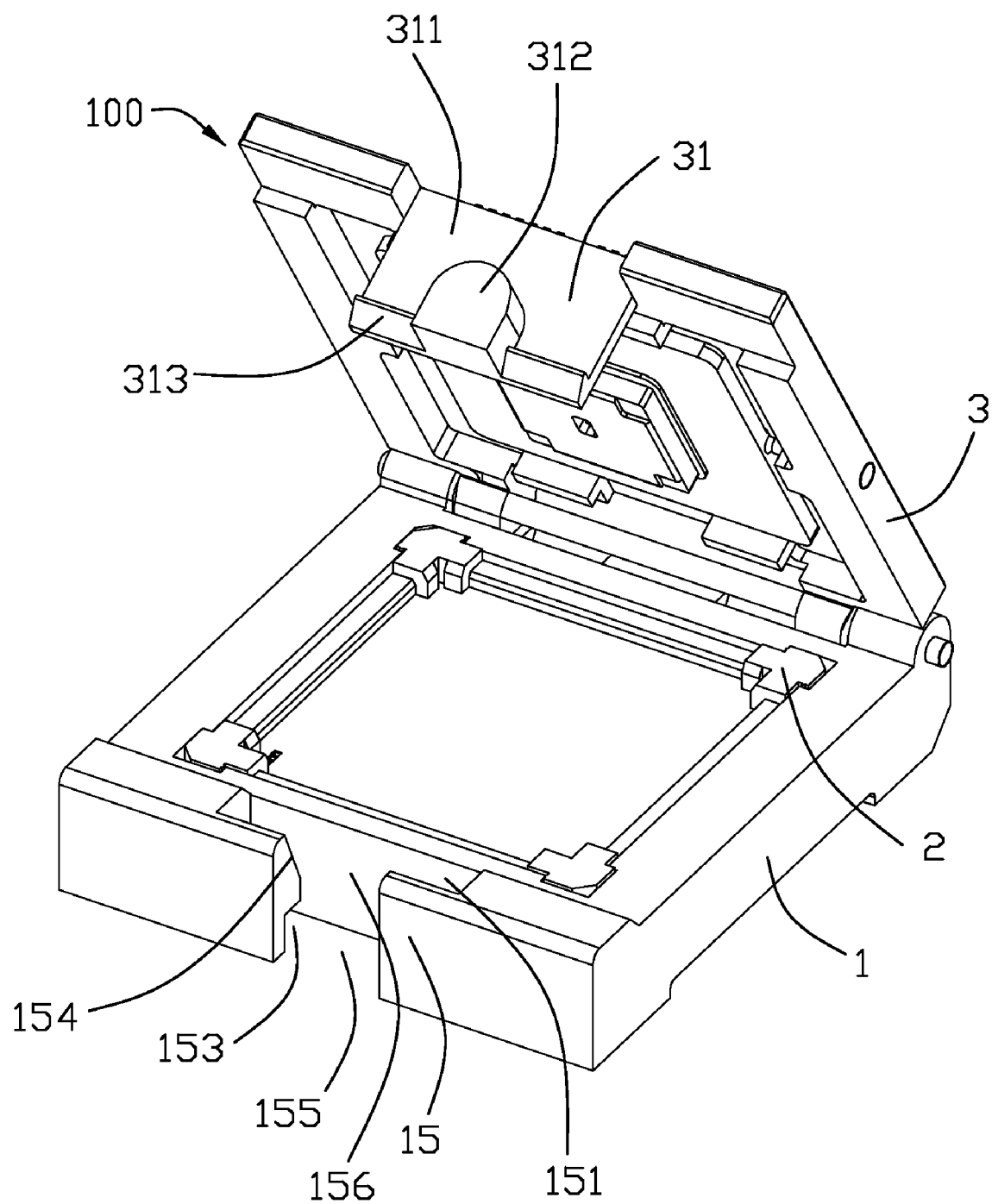
FIG. 3 is a perspective view of the socket with its cover lid located in an opening position.
Figure 4:
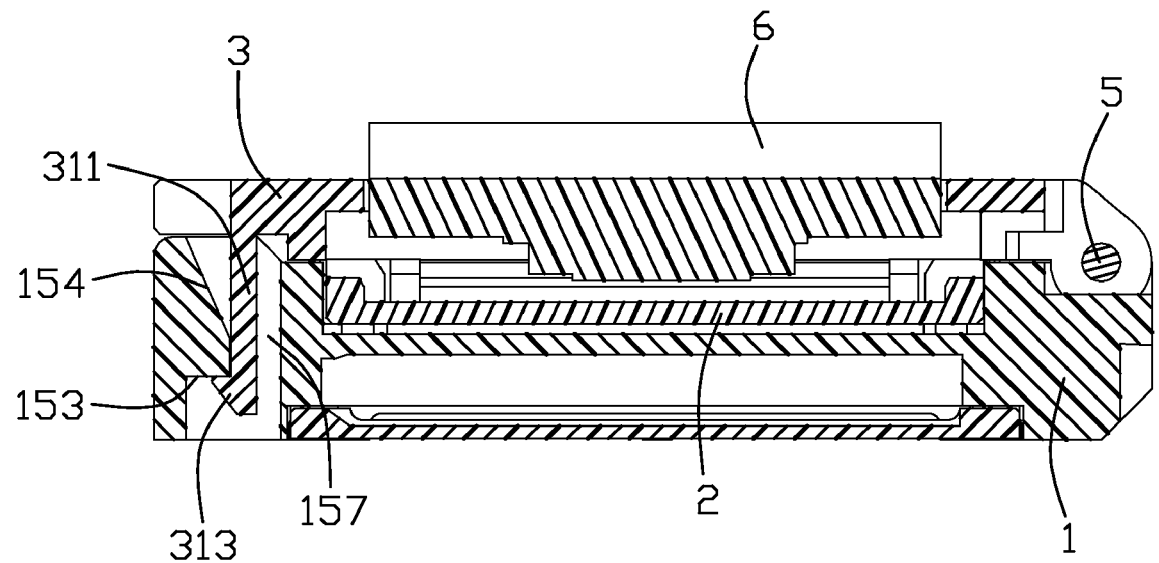
FIG. 4 is a cross-sectional view of the socket with its cover lid located in a closed position.

Referring to FIG. 1 to FIG. 4, a socket 100 in accordance with the present invention is used for electrically connecting an IC package (not shown) to a printed circuit board (PCB) (not shown). The socket 100 comprises an insulative housing 1, a floatable board 2 received in the housing 1, a cover lid 3 assembled to the housing 1, and a bottom plate 4 located at the bottom of the housing 1.

The insulative housing 1 forms a receiving room 11 for receiving the semiconductor package. A plurality of slots 16 are arranged at the four corners of the receiving room 11. The floatable board 2 is received in the receiving room 11 for abutting the IC package, which has a plurality of vertical tabs 21 received in the slots 16. The housing 1 further comprises a bottom wall 12 with a plurality of passageways 13 thereon. A plurality of contacts (not shown) are received in the passageways 13, and one end of the contacts extend into the receiving room 11 for connecting with the semiconductor package, the other ends are soldered to the PCB. The bottom plate 4 also includes a plurality of through holes 41 corresponding to the passageways 13 of the housing 1 for retaining the contact together. One edge of the insulative housing 1 forms an axle hole 14, and the respective edge of the housing 1 forms a pair of step portions 15. The step portions 15 extend into a groove 151, which is located at the inner side of the step portions 15. A gap 155 is formed between the step portions 15 communicating with the groove 151. Each step portion 15 comprises an inclined surface 154 extending downwardly and forwardly into the groove 151, and a holding portion 153 located at the bottom of the inclined surface 154.

The cover lid 3 is assembled to the insulative housing 1 by an axle 5, and the axle 5 is retained by the axle hole 14 of the housing 1. The cover lid 3 can rotate round the axle 5 to be in the opened position or in a closed position. The free end of the cover lid 3 extends downwardly to form a latch member 31 which is integrally molded on the cover lid 3 to save the component of the socket 100. The latch member 31 comprises a vertical wall 311 extending downwardly from the cover lid 3, a pressing portion 312 located at the bottom of the vertical wall 311 and a pair of hooks 313 located at the opposite sides of the pressing portion 312. An interspace 157 is formed between the vertical wall 311 and the lateral wall 156 of the groove 151, and the vertical wall 311 can bend inwardly into the interspace 157 when an external force acts on the pressing portion 312. The cover lid 3 further comprises a heat sink 6 located at the top surface of the IC package.

When the cover lid 3 rotates around the housing 1 to be closed, the hooks 313 of the latch member 31 touches with the inclined surface 154 of the step portion 15, and the vertical wall 311 is received in the groove 151 and bends inwardly. When the cover lid 3 is closed completely, the hooks 313 engage with the holding portions 153, and the vertical wall 151 is received in the groove 151 and resumes back to the vertical state. When the cover lid 3 needs to be opened, the pressing portion 312 is depressed inwardly into the interspace 157, in this time, the hooks 313 disengages with the holding portion 153 and slides on the inclined surface 154 to open the cover lid 3.

The latch member 31 is integrally molded on the cover lid 3, the components of the socket 100 are fewer, and the cost of the socket 100 is lower.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A socket, for electrically connecting an Integrated Circuit(IC) package and a printed circuit board, comprising:
   an insulative housing defining a plurality of passageways, and defining a receiving room for receiving the IC package to be tested therein;
   a floatable board received in the receiving room for abutting against the IC package; and
   a cover lid assembled to the housing being pivotable from an opened position to a closed position;
   wherein the cover lid comprises a latch member integrally molded thereon, and the insulative housing forms a pair of step portions for mating with the latch member to keep the cover lid in the closed position; wherein
   the latch member comprises a vertical wall extending downwardly, and the housing forms a groove located at an inner side of the step portions for receiving the vertical wall; wherein
   each step portion comprises an inclined surface extending downwardly and inwardly into the groove and a holding portion located at a bottom of the inclined surface, and the latch member forms a pair of hooks engaging with the holding portions; and wherein
   the latch member comprises a pressing portion located at a bottom of the vertical wall, and the pair of hooks are disposed at opposite sides of the pressing portion.

2. The socket as claimed in claim 1, wherein the pair of the step portions form a gap therebetween, and the pressing portion is received in the gap when the cover lid is in the closed position.

3. The socket as claimed in claim 1, wherein the hooks engage with the inclined surfaces of the step portions, when the cover lid rotates to its closed position.

4. The socket as claimed in claim 1, wherein an interspace is formed between the vertical wall and an inner side lateral wall of the groove when the cover lid is in the closed position.

5. The socket as claimed in claim 1, further comprising a bottom plate mounted on the bottom of the insulative housing.

6. The socket as claimed in claim 5, wherein the bottom plate forms a plurality of through holes corresponding to the passageways of the housing.

* * * * *